(12) United States Patent
Jung et al.

(10) Patent No.: US 8,959,761 B2
(45) Date of Patent: Feb. 24, 2015

(54) METHOD OF MANUFACTURING POLYMER ELECTRODE AND POLYMER ACTUATOR EMPLOYING THE POLYMER ELECTRODE

(75) Inventors: Kyu-dong Jung, Suwon-si (KR); Seung-Tae Choi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 338 days.

(21) Appl. No.: 13/277,298

(22) Filed: Oct. 20, 2011

(65) Prior Publication Data

US 2012/0200200 A1 Aug. 9, 2012

(30) Foreign Application Priority Data

Feb. 8, 2011 (KR) .......................... 10-2011-0011107

(51) Int. Cl.
| | |
|---|---|
| *H05K 3/02* | (2006.01) |
| *H05K 3/30* | (2006.01) |
| *H01L 41/00* | (2013.01) |
| *H02N 2/00* | (2006.01) |
| *H01L 41/047* | (2006.01) |
| *H01L 41/29* | (2013.01) |
| *H01L 41/27* | (2013.01) |
| *H01L 41/297* | (2013.01) |
| *H01L 41/193* | (2006.01) |

(52) U.S. Cl.
CPC ............ *H01L 41/0478* (2013.01); *H01L 41/29* (2013.01); *H01L 41/0471* (2013.01); *H01L 41/27* (2013.01); *H01L 41/297* (2013.01); *H01L 41/193* (2013.01)
USPC .............................. 29/846; 29/832; 310/365

(58) Field of Classification Search
CPC ... H01L 41/0478; H01L 41/29; H01L 41/047; H05K 2201/0355
USPC ..................................... 29/846, 832; 310/365
See application file for complete search history.

(56) References Cited

U.S. PATENT DOCUMENTS

| | | | | |
|---|---|---|---|---|
| 6,365,917 | B1* | 4/2002 | Yamazaki | ........................ 257/72 |
| 7,814,648 | B2* | 10/2010 | Nakagawa | ....................... 29/832 |
| 8,313,355 | B2* | 11/2012 | Fujii | ............................... 445/24 |
| 2004/0239840 | A1* | 12/2004 | Ikeda et al. | ................... 349/106 |
| 2005/0084999 | A1* | 4/2005 | Satou | .............................. 438/48 |
| 2005/0104071 | A1* | 5/2005 | Satou | .............................. 257/72 |
| 2005/0233509 | A1* | 10/2005 | Satou | ............................ 438/158 |

(Continued)

FOREIGN PATENT DOCUMENTS

| | | | |
|---|---|---|---|
| JP | 2008-148518 A | | 6/2006 |
| JP | 2008148518 | * | 6/2006 |

(Continued)

OTHER PUBLICATIONS

Lee, M. et., al. "Fine patterning of glycerol-doped PEDOT: PSS on hydrophobic PVP dielectric with ink jet source and drain electrode of OTFTs" Organic Electronics, vol. 11, 2010, pp. 854-859.

*Primary Examiner* — David Angwin
(74) *Attorney, Agent, or Firm* — Sughrue Mion, PLLC

(57) ABSTRACT

A method of manufacturing a polymer electrode is provided. The method includes adhering a shadow mask onto a substrate, forming a hydrophilic electrode pattern on the substrate, coating the hydrophilic electrode pattern of the substrate with a conductive polymer water solution, removing the shadow mask, and drying the conductive polymer water solution, thus forming the polymer electrode.

29 Claims, 12 Drawing Sheets

(56) References Cited

U.S. PATENT DOCUMENTS

| | | | |
|---|---|---|---|
| 2005/0250308 A1* | 11/2005 | Yamaguchi et al. | 438/618 |
| 2007/0209200 A1* | 9/2007 | Ohmi et al. | 29/846 |
| 2010/0192372 A1* | 8/2010 | Nakagawa | 29/846 |
| 2012/0200200 A1* | 8/2012 | Jung et al. | 310/365 |

FOREIGN PATENT DOCUMENTS

| | | |
|---|---|---|
| KR | 10-2008-0100757 A | 11/2008 |
| KR | 10-2009-0109358 A | 10/2009 |
| KR | 10-2010-0065769 A | 6/2010 |

\* cited by examiner

METHOD OF MANUFACTURING POLYMER ELECTRODE AND POLYMER ACTUATOR EMPLOYING THE POLYMER ELECTRODE

CROSS-REFERENCE TO RELATED APPLICATION

This application claims priority from Korean Patent Application No. 10-2011-011107, filed on Feb. 8, 2011, in the Korean Intellectual Property Office, the disclosure of which is incorporated herein in its entirety by reference.

BACKGROUND

1. Field

Apparatuses and methods consistent with exemplary embodiments relate to methods of manufacturing polymer electrodes and polymer actuators employing the polymer electrodes.

2. Description of the Related Art

Polymer actuators use a solid electroactive polymer (EAP) which has a fast response characteristic, a large displacement, and a small density as compared to a shape memory alloy (SMA) or an electroactive ceramic (EAC) that are materials used by other small actuators. Thus, research and development of polymer electrodes have been actively conducted. For example, a polymer actuator is able to operate with a thickness of tens of μm according to its application, and at a low voltage (for example, below 5 V), which is mainly problematic in a mobile device, and thus polymer actuators have a variety of applications such as in microelectromechanical systems (MEMS), bio devices, energy yielding devices, etc, as well as actuators in auto-focusing and zooming units of camera modules.

Research into using polymer electrodes rather than using metal electrodes has been actively conducted. Polymer electrodes may be manufactured by printing and drying, for example, a conducting polymer solution in an electrode pattern through screen printing or inkjet printing.

SUMMARY

One or more exemplary embodiments provide a method of manufacturing polymer electrodes that is different from a screen printing method or an inkjet printing method, and polymer actuators employing the manufactured polymer electrodes.

Additional exemplary aspects will be set forth in part in the description which follows and, in part, will be apparent from the description, or may be learned by practice of the exemplary embodiments.

According to an aspect of an exemplary embodiment, there is provided a method of manufacturing a polymer electrode, the method including: adhering a shadow mask onto a surface of a substrate, wherein the shadow mask comprises one or more cut-out holes forming an electrode pattern; forming a hydrophilic electrode pattern on a region of the surface of the substrate that is not covered by the shadow mask; coating the hydrophilic electrode pattern of the substrate with a conductive polymer water solution; removing the shadow mask; and forming the polymer electrode by drying the conductive polymer water solution.

The substrate may have a hydrophobic surface layer, wherein the adhering the shadow mask comprises adhering the shadow mask to the hydrophobic surface layer of the substrate; and the forming of the hydrophilic electrode pattern includes: performing hydrophilic surface reforming on the region of the surface of the hydrophobic surface layer that is not covered by the shadow mask.

$O_2$ plasma ashing may be used to perform the hydrophilic surface reforming.

The conductive polymer water solution may include PEDOT:PSS or polyanyline.

The shadow mask may include an adhesion layer. The adhesion layer may be formed of PDMS or a cellulose based polymer. The adhesion layer may have a hydrophobic surface. The shadow mask may further include a support layer for supporting the adhesion layer. The support layer may be formed of PET, PEN, or PI. The method may further include: removing the support layer after forming the hydrophilic electrode pattern.

The method may further include: squeezing the coated conductive polymer water solution to have a thickness the same as a thickness of the shadow mask. A thickness of the polymer electrode may be proportional to the thickness of the shadow mask. The polymer electrode formed by drying the conductive polymer water solution may have a thickness of about 0.01 μm to about 1 μm.

The hydrophobic surface layer may be formed of an electroactive polymer (EAP) in which a displacement occurs according to an electrical stimulus.

The hydrophobic surface layer may be formed of a PVDF based polymer. The hydrophobic surface layer may be formed of PVDF, P(VDF-TrFE), P(VDF-TrFE-CFE), or P(VDF-TrFE-CTFE).

According to an aspect of another exemplary embodiment, there is provided a method of manufacturing a polymer electrode, the method including: forming a polymer deformation layer in a substrate: adhering a shadow mask onto a surface of the polymer deformation layer, wherein the shadow mask comprises one or more cut-out holes forming an electrode pattern; forming a hydrophilic electrode pattern on a region of the surface of the polymer deformation layer that is not covered by the shadow mask; coating the hydrophilic electrode pattern of the polymer deformation layer with a conductive polymer water solution; removing the shadow mask; and forming a polymer hydrophobic surface layer by drying the conductive polymer water solution.

According to an aspect of another exemplary embodiment, there is provided a multilayer structure in which the polymer deformation layer and the polymer electrode layer is alternately stacked and is formed by repeating the forming the polymer deformation layer and forming an electrode pattern.

BRIEF DESCRIPTION OF THE DRAWINGS

These and/or other aspects will become apparent and more readily appreciated from the following description of exemplary embodiments, taken in conjunction with the accompanying drawings of which.

DETAILED DESCRIPTION

Exemplary embodiments will now be described more fully with reference to the accompanying drawings. In the draw- FIGS. 1A through 1F are cross-sectional views illustrating a method of manufacturing a polymer electrode according to an exemplary embodiment. FIGS. 2A through 2F are views for explaining a method of manufacturing a polymer electrode at a wafer level corresponding to the method of FIGS. 1A through 1F, respectively, according to another exemplary embodiment.

Figure 1A:
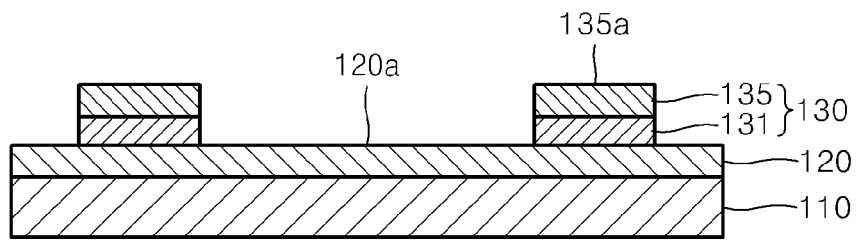
FIGS. 1A through 1F are cross-sectional views illustrating a method of manufacturing a polymer electrode according to an exemplary embodiment.
Figure 2A:
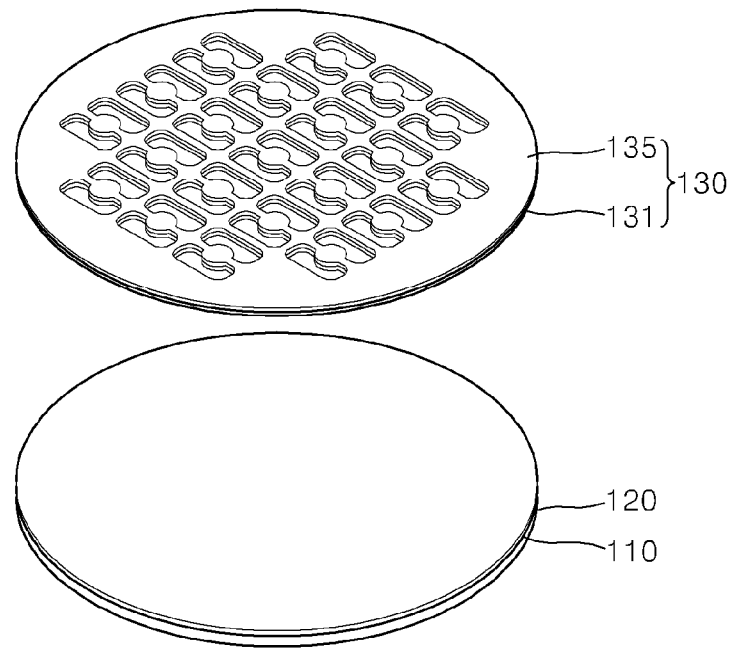
FIGS. 2A through 2F are views for explaining a method of manufacturing a polymer electrode at a wafer level corresponding to the method of FIGS. 1A through 1F, respectively, according to another exemplary embodiment.

Referring to FIGS. 1A and 2A, a hydrophobic surface layer 120 is formed on a substrate 110. For example, the hydrophobic surface layer 120 may be formed of a hydrophobic polyvinylidene fluoride (PVDF)-based polymer, such as PVDF, P(VDF-TrFE)(poly vinylidenefluoride-trifluoroethylene), P(VDF-TrFE-CFE) (poly vinylidenefluoride-trifluoroethylene-chlorofluoroethylene), or P(VDF-TrFE-CTFE) (poly(vinylidene fluoride-trifluoroetheylene-chlorotrifluoro ethylene) that is an electroactive polymer (EAP) used for a deformation layer of a polymer actuator. A material forming the hydrophobic surface layer 120 is not limited to a hydrophobe. The hydrophobic surface layer 120 may be formed of a material having a hydrophobic surface through surface reforming or surface modification. Thus, the hydrophobic surface layer 120 may use an appropriate material according to its application.

Next, a shadow mask 130 is placed on the hydrophobic surface layer 120. The shadow mask 130 is a sheet having a predetermined electrode pattern. The electrode pattern of the shadow mask 130 is embodied as cut-out holes formed through the sheet. The shadow mask 130 may be a double layer sheet including an adhesion layer 131 and a protection layer 135. The adhesion layer 131 prevents a conducting polymer aqueous solution (140 of FIG. 1E), as will be described below, from permeating between the hydrophobic surface layer 120 and the shadow mask 130 by adhering the shadow mask 130 onto the hydrophobic surface layer 120 when the conducting polymer aqueous solution 140 is dispensed. The adhesion layer 131 may be formed of a pressure sensitive adhesive material. The adhesion layer 131 may be formed of, for example, polydimethylsiloxane (PDMS). The adhesion layer 131 may be formed of a cellulose based polymer having a high surface tension, in addition to or instead of PDMS. The protection layer 135 may be formed of polyester (PET) as a material for supporting a shape of the shadow mask 130. The protection layer 135 may be formed of various polymers such as polyethylene naphthalate (PEN), or polyimide (PI), etc. in addition to the PET. Alternately, the shadow mask 130 may be a single layer sheet as will be described below.

Figure 1B:
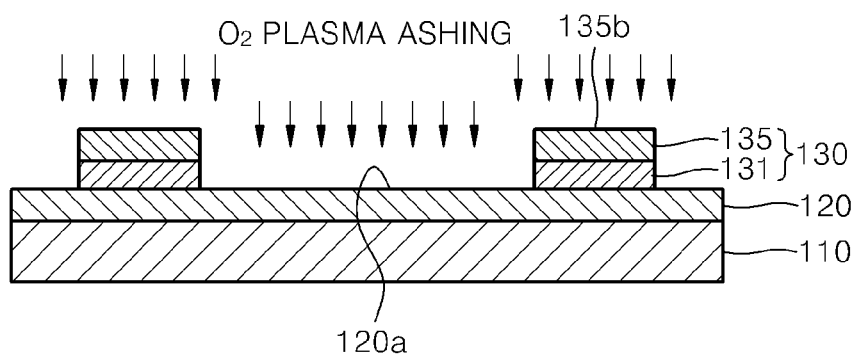
Figure 2B:
Figure 2B:
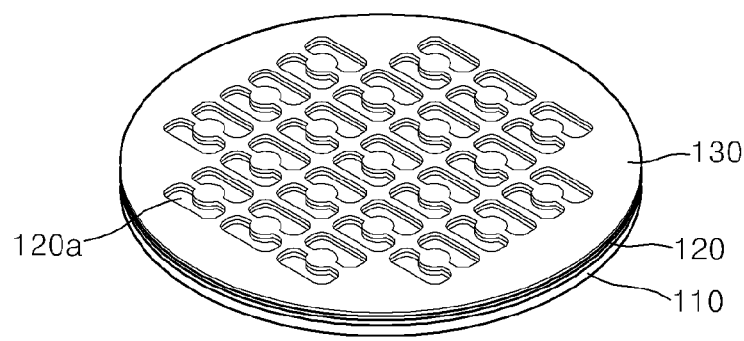

Next, referring to FIGS. 1B and 2B, $O_2$ plasma ashing is performed on a region or regions 120a of the surface of the hydrophobic surface layer 120 that is not covered by the shadow mask 120. The $O_2$ plasma ashing selectively reforms the exposed region 120b of the hydrophobic surface layer 120 and forms a hydrophilic pattern on the surface of the hydrophobic surface layer 120. A well-known surface reforming method may be used instead of the $O_2$ plasma ashing.

If the $O_2$ plasma ashing is performed, the region 120a of the surface of the hydrophobic surface layer 120 that is not covered by the shadow mask 120 is changed from hydrophobic to hydrophilic. That is, hydrophobic surface reforming is selectively performed on the region 120a of the surface of the hydrophobic surface layer 120 in an electrode pattern through the $O_2$ plasma ashing.

Figure 1C:
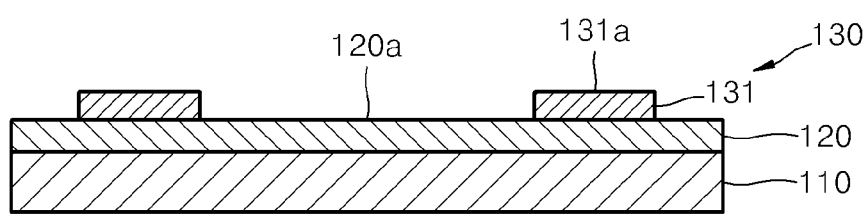
Figure 2C:
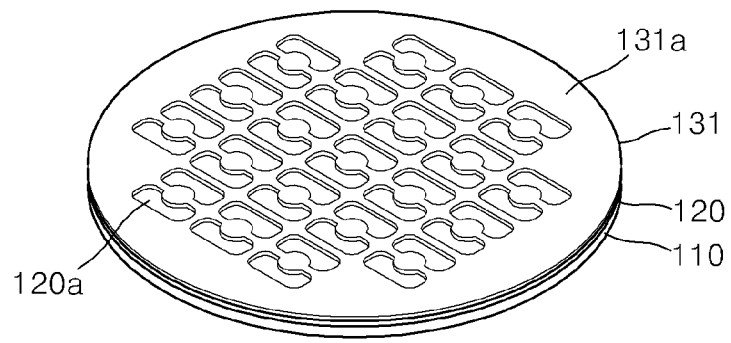

Referring to FIGS. 1C and 2C, the protection layer 135 is removed from the shadow mask 130 and a surface 131a of the adhesion layer 131 is exposed. The PDMS forming the adhesion layer 131 is hydrophobic, and thus the exposed surface 131a of the adhesion layer 131 is also hydrophobic.

Figure 1D:
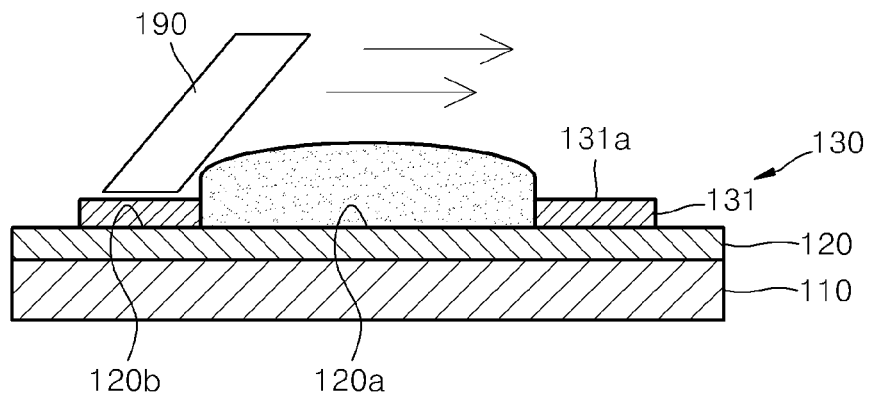
Figure 2D:
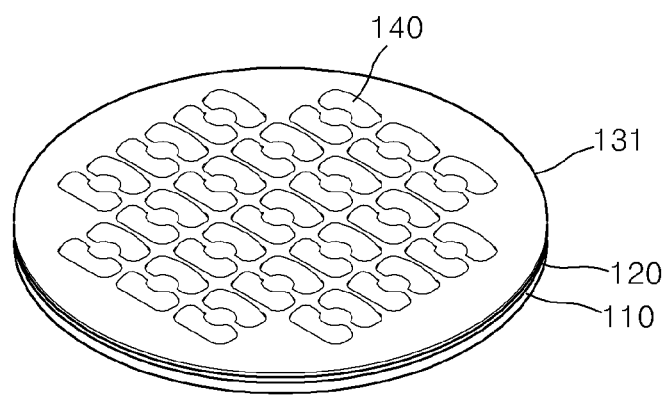

Referring to FIGS. 1D and 2D, the conducting polymer aqueous solution 140 is dispensed in the region 120a of the surface of the hydrophobic surface layer 120. The conducting polymer aqueous solution 140 may be an aqueous solution in which, for example, poly(3,4-ethylenedioxythiophene):poly(styrenesulfonate) (PEDOT:PSS) is dispersed. As another example, the conducting polymer aqueous solution 140 may be an aqueous solution in which polyaniline or another well-known conducting polymer is dispersed.

The conducting polymer aqueous solution 140 is coated on the region 120a of the surface of the hydrophobic surface layer 120 that is not covered by the adhesion layer 131 of the shadow mask 130 and forms the electrode pattern. The adhesion layer 131 prevents the conducting polymer aqueous solution 140 from being coated on a region 120b of the surface of the hydrophobic surface layer 120 except the region 120a of the electrode pattern. The surface 131a of the adhesion layer 131 is hydrophobic, and thus the conducting polymer aqueous solution 140 is not coated on a top surface of the adhesion layer 131.

Figure 1E:
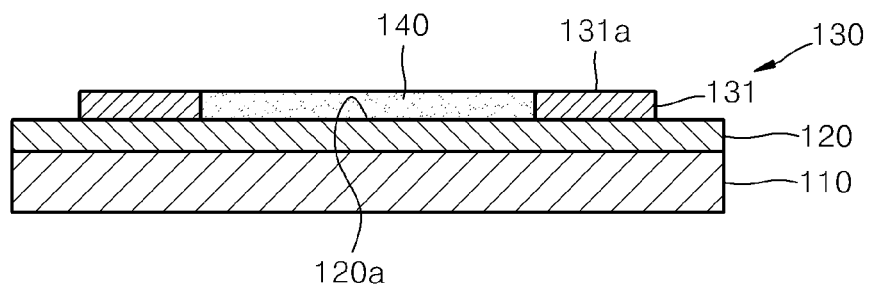
Figure 2E:
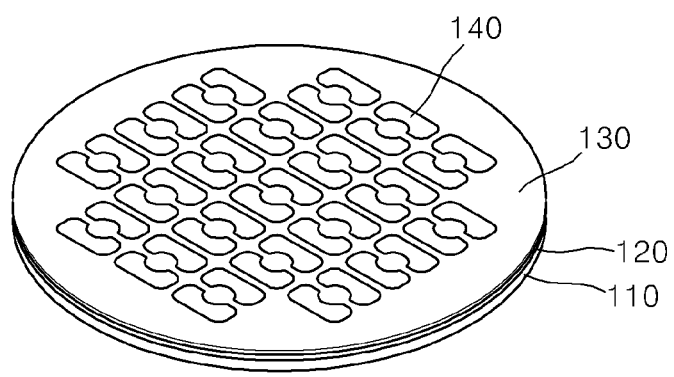

Then, as shown in FIGS. 1D, 1E, and 2E, the conducting polymer aqueous solution 140 is squeezed by using a push stick 190 so that the conducting polymer aqueous solution 140 is uniformly coated on the hydrophobic surface layer 120 at a thickness of the adhesion layer 131. For example, if the thickness of the adhesion layer 131 is 30 μm, the squeezed conducting polymer aqueous solution 140 may be coated at a thickness of 30 μm. The thickness of the conducting polymer aqueous solution 140 may be determined according to a desired thickness of a polymer electrode 140' that is formed after being dried.

Inkjet printing used as a related art method of manufacturing a polymer electrode forms a pattern by spraying droplets one by one through an inkjet nozzle, which increases a processing time, and, when droplet marks are stacked, transfers the droplet marks, which may cause a fabric wrinkle or a non-uniform thickness. Furthermore, as a nozzle spraying time increases, a polymer electrode material may harden in a nozzle and thus block the nozzle. In addition, sprayed droplets may spread outside the electrode pattern. Meanwhile, methods according to the exemplary embodiments described herein reduce a processing time of the conducting polymer aqueous solution 140 and prevents the electrode pattern from spreading due to the shadow mask 130 when the conducting polymer aqueous solution 140 is dispensed, thereby realizing a uniform thickness by squeezing the conducting polymer aqueous solution 140.

Figure 1F:
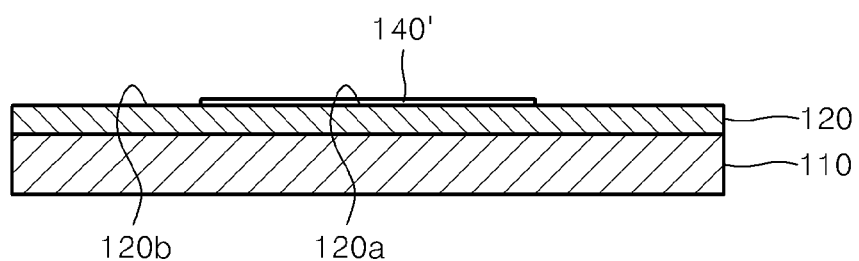
Figure 2F:
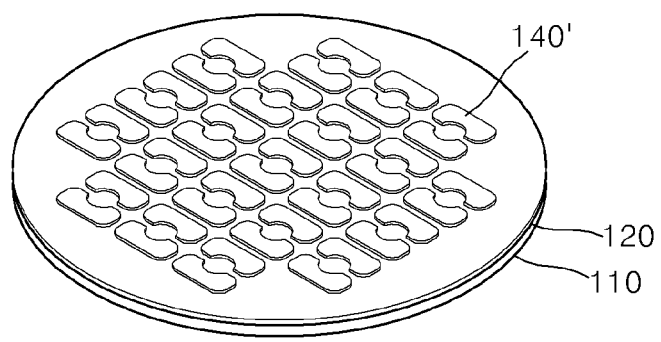

Referring to FIGS. 1F and 2F, the adhesion layer 131 is removed, and moisture is removed from the conducting polymer aqueous solution 140 through a drying process such as baking, and thus the polymer electrode 140' is completed. Although the conducting polymer aqueous solution 140 partially remains on the top surface of the adhesions layer 131 during the squeezing process, the conducting polymer aqueous solution 140 remains only on the region 120a of the electrode pattern by removing the adhesion layer 131. The region 120b of the surface of the hydrophobic surface layer 120 in which the adhesion layer 131 is disposed is not reformed and thus remains hydrophobic. Although the adhesion layer 131 is removed, the conducting polymer aqueous solution 140 does not spread outside the region 120a of the electrode pattern.

The completed polymer electrode 140' is formed by drying the conducting polymer aqueous solution 140 having a uniform thickness due to the squeezing, and thus the polymer electrode 140' has a very uniform thickness. For an example, the polymer electrode 140' may have thickness uniformity such that thickness dispersion is within 10%. The thickness of the polymer electrode 140' may be determined according to the thickness of the adhesion layer 131, for example, between about 0.01 μm to about 1 μm. For example, screen printing used as a method of manufacturing a polymer electrode uses a conducting polymer in a paste having a high viscosity, and has a large mesh of 100 μm of a silkscreen mask, which makes it difficult for use a fine pattern and increases a thickness of an electrode greater than tens of μm. Meanwhile, methods according to the exemplary embodiments described herein do not increase a viscosity of the conducting polymer aqueous solution 140 and use a squeezing method, which enables formation of a polymer electrode of a very small thickness less than 1 μm.

Although the shadow mask 130 has been described as a double layer, exemplary embodiments are not limited thereto. The shadow mask 130 may be a single layer, and may not be formed of a hydrophobic material. If the shadow mask 130 is a single layer, the process described with reference to FIGS. 1C and 2C is omitted, and the other processes are the same as described above.

Figure 3:
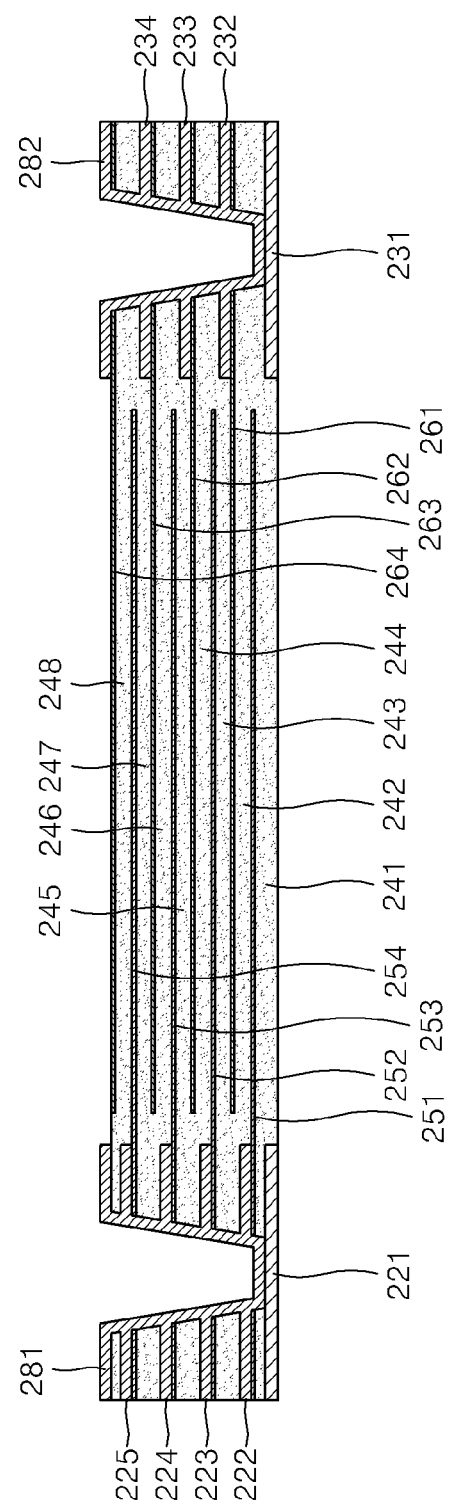
FIG. 3 is a cross-sectional view of a polymer actuator according to an exemplary embodiment.

FIG. 3 is a cross-sectional view of a polymer actuator 200 employing a polymer electrode according to an exemplary embodiment. FIGS. 4A through 4J are cross-sectional views illustrating a method of manufacturing the polymer actuator 200 of FIG. 3 according to an exemplary embodiment.

Referring to FIG. 3, the polymer actuator 200 of the present embodiment includes a plurality of polymer deformation layers 241 through 248 that are stacked in multiple layers, a plurality of first polymer electrode layers 251 through 254, and a plurality of second polymer electrode layers 261 through 264 that are disposed between the polymer deformation layers 241 through 248. A plurality of first metal electrodes 222 through 225 are respectively disposed at one end of each of the first polymer electrode layers 251 through 254, and a plurality of second metal electrodes 232 through 234 are respectively disposed at the other end of each of the second polymer electrode layers 261 through 263. First and second electrode terminals 281 and 282 are electrically connected to the first metal electrodes 222 through 225 and the second metal electrodes 232 through 234, respectively.

The polymer deformation layers 241 through 248 are formed of EAPs that may be deformed according to an electrical stimulation. That is, if power is applied to the polymer deformation layers 241 through 248 through the first and second electrode terminals 281 and 282, the polymer deformation layers 241 through 248 that are disposed between the first polymer electrode layers 251 through 254 and the second polymer electrode layers 261 through 264 are deformed according to the applied voltage. The EAPs include various types of polymers including a solid electrolyte polymer, an electrostrictive polymer, a dielectric elastomer, an ionic polymer metal composite, a conducting polymer, and the like. For example, the polymer deformation layers 241 through 248 may be formed of a PVD based solid electrolyte polymer such as PVDF, P(VDF-TrFE), P(VDF-TrFE-CFE), or P(VDF-TrFE-CTFE). Furthermore, materials of the polymer deformation layers 241 through 248 may use well-known EAPs that may be hydrophobic or have hydrophobic surfaces due to surface reforming. The polymer deformation layers 241 through 248 may be understood as the hydrophobic surface layer 120 of FIG. 1A, and thus the first polymer electrode layers 251 through 254 and the second polymer electrode layers 261 through 264 may be formed by using the method of manufacturing the polymer electrode described above.

According to the method of manufacturing the polymer electrode described above, the first polymer electrode layers 251 through 254 and the second polymer electrode layers 261 through 264 may have very small thicknesses between about 0.01 μm to about 1 μm, and may have minimal differences in thermal expansion coefficient with respect to the polymer deformation layers 241 through 248, thereby promoting mechanical stability. Thus, the polymer actuator 200 may attain mechanical stability even though the polymer deformation layers 241 through 248 are stacked in multiple layers.

Meanwhile, since the first polymer electrode layers 251 through 254 and the second polymer electrode layers 261 through 264 are formed of polymers, the Young's modulus of the first polymer electrode layers 251 through 254 and that of the second polymer electrode layers 261 through 264 is below about several GPa, which is much lower than that of a metal electrode, which is between about 70 and about 400 GPa. For example, the Young's modulus of aluminum is between about 100 and about 400 GPa, the Young's modulus of PVDF is approximately 2 GPa, and the Young's modulus of PEDOT is approximately 2 GPa. If metal electrodes are disposed at both surfaces of the polymer deformation layers 241 through 248 like a polymer actuator, the metal electrodes may prevent the polymer deformation layers 241 through 248 from operating due to a relatively high Young's modulus. However, since the first polymer electrode layers 251 through 254 and the second polymer electrode layers 261 through 264 are formed of polymers having a low Young's modulus, like PEDOT in the present embodiment, the polymer actuator 20 inhibits prevention of the first polymer electrode layers 251 through 254 and the second polymer electrode layers 261 through 264 with respect to deformations of the polymer deformation layers 241 through 248, thereby increasing an actuation displacement of the polymer actuator 20. A large displacement actuator is necessary for an auto-focusing/zooming unit of a camera module for a mobile device, and thus the polymer actuator 200 of the present embodiment may perform large displacement actuation.

Furthermore, since the first polymer electrode layers 251 through 254 and the second polymer electrode layers 261 through 264 are formed of polymers like the polymer deformation layers 241 through 248, the first polymer electrode layers 251 through 254 and the second polymer electrode layers 261 through 264 may have thermal expansion coefficients similar to those of the polymer deformation layers 241 through 248. For example, a thermal expansion coefficient of aluminum is between about 10 and 20 ppm, a thermal expansion coefficient of PVDF is approximately 100 ppm, and a thermal expansion coefficient of PEDOT is approximately 80 ppm. If metal electrodes are disposed at both surfaces of the polymer deformation layers 241 through 248 like the polymer actuator, deformations may occur in a manufacturing process or a use environment with respect to a temperature change due to a large difference in the thermal expansion coefficient between the metal electrodes and the polymer deformation layers 241 through 248. For example, if the metal electrodes are disposed at both surfaces of the polymer deformation layers 241 through 248 at a reflow temperature of about 250 degrees during a manufacturing process, deformations may occur between the metal electrodes and the polymer deformation layers 241 through 248 due to a large difference in the thermal expansion coefficients. However, since the first polymer electrode layers 251 through 254 and the second polymer electrode layers 261 through 264 are formed of polymers having thermal expansion coefficients similar to those of the polymer deformation layers 241 through 248, like PEDOT in the present embodiment, the polymer actuator 20 may inhibit deformations with respect to the temperature change.

A process of manufacturing the polymer actuator 20 will now be described with reference to FIGS. 4A through 4J.

Figure 4A:
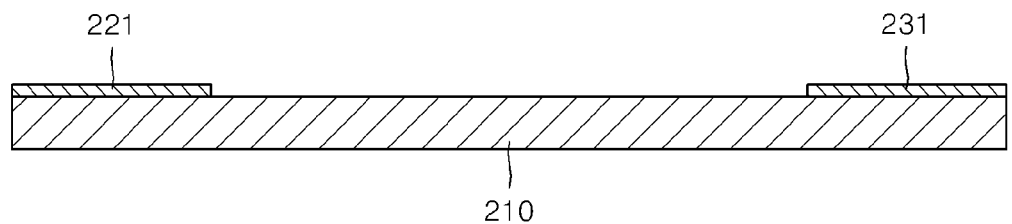
FIGS. 4A through 4J are cross-sectional views illustrating a method of manufacturing the polymer actuator of FIG. 3 according to an exemplary embodiment.

Referring to FIG. 4A, first and second etching prevention layers 221 and 231 are formed in a predetermined region of a substrate 210. The first and second etching prevention layers 221 and 231 may be disposed near opposite sides of the substrate 210. A region between the first and second etching prevention layers 221 and 231 on the substrate 210 is an actuation region in which displacement occurs.

Figure 4B:
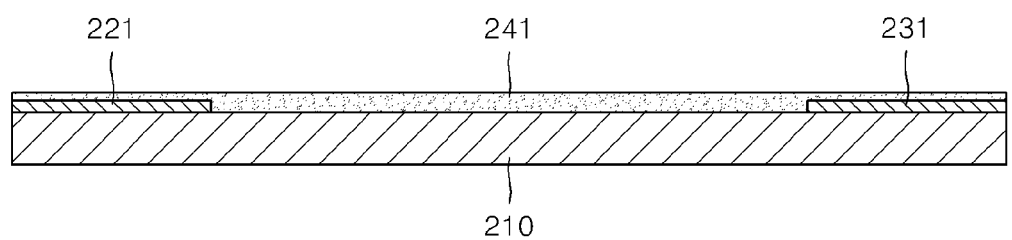

Referring to FIG. 4B, the polymer deformation layer 241 is formed on an entire top surface of the exposed portion of the substrate 210 and on the first and second etching prevention layers 221 and 231. The polymer deformation layer 241 may be formed of a hydrophobic EAP. For example, the polymer deformation layer 241 may be formed of a PVDF based solid electrolyte polymer such as PVDF, P(VDF-TrFE), P(VDF-TrFE-CFE), or P(VDF-TrFE-CTFE).

Figure 4C:
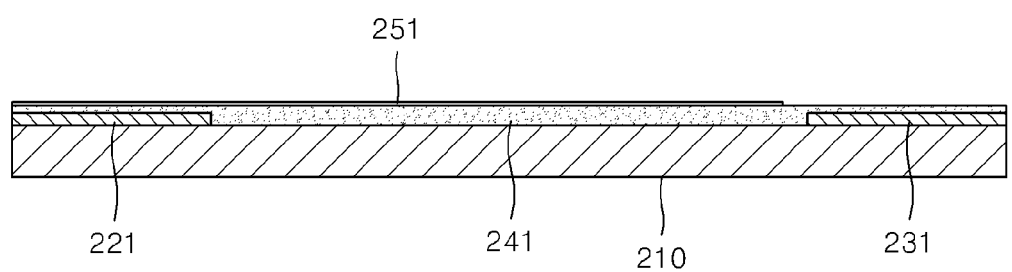

Referring to FIG. 4C, the first polymer electrode layer 251 is formed on a top surface of the polymer deformation layer 241. The first polymer electrode layer 251 may be formed in an actuation region of a center of a top surface of the polymer deformation layer 241 and a region of the polymer deformation layer 241 under which the first etching prevention layer 221 is formed. The first polymer electrode layer 251 may be formed of, for example, PEDOT:PSS or polyaniline. The polymer deformation layer 241 may be used as the hydrophobic surface layer 120 of FIG. 1A, and thus the first polymer electrode layer 251 may be formed on the polymer deformation layer 241 according to the method of manufacturing the polymer electrode described above. As described above, the first polymer electrode layer 251 may have a thickness between about 0.01 μm to about 1 μm by appropriately selecting a thickness of the shadow mask 130. Furthermore, the first polymer electrode layer 251 may have a very uniform thickness through use of a squeezing process (refer to FIG. 1D), thereby having a thickness uniformity of thickness dispersion within 10%.

Figure 4D:
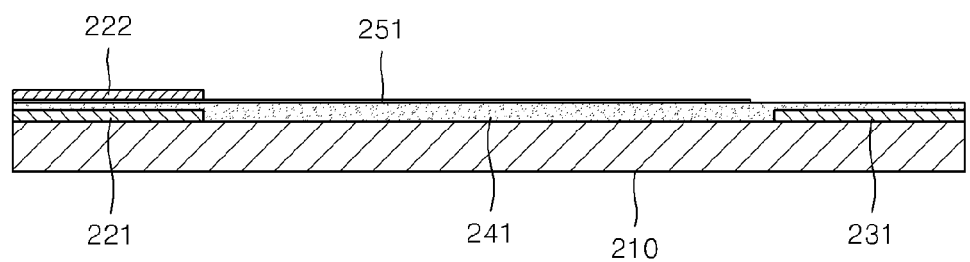

Referring to FIG. 4D, a first metal electrode 222 is formed on a top surface of the first polymer electrode layer 251. The first metal electrode 222 is disposed in a top portion of the region of the first polymer electrode layer 251 under which the first etching prevention layer 221 is formed.

Figure 4E:
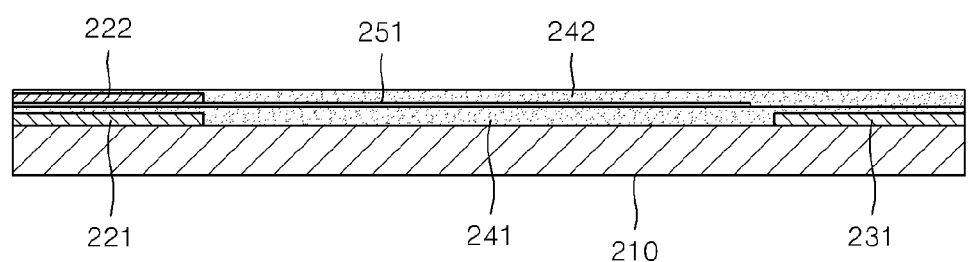

Referring to FIG. 4E, the polymer deformation layer 242 is formed on the top surfaces of the polymer deformation layer 241, the first polymer electrode layer 251, and the first metal electrode 222.

Figure 4F:
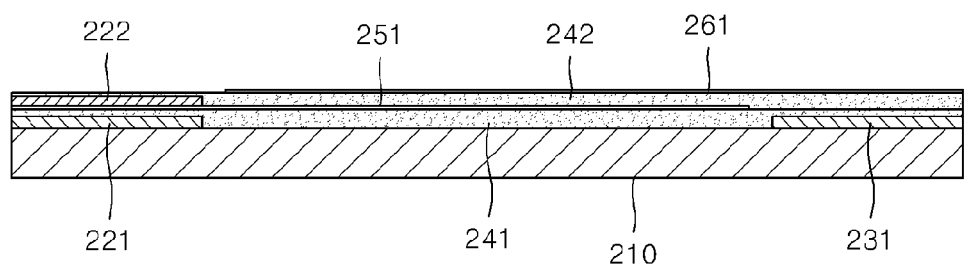

Referring to FIG. 4F, a second polymer electrode layer 261 is formed on a top surface of the polymer deformation layer 242. The second polymer electrode layer 261 may be formed in an actuation region of a center of a top surface of the polymer deformation layer 2421 and a region of the polymer deformation layer 242 under which the second etching prevention layer 231 is formed.

Figure 4G:
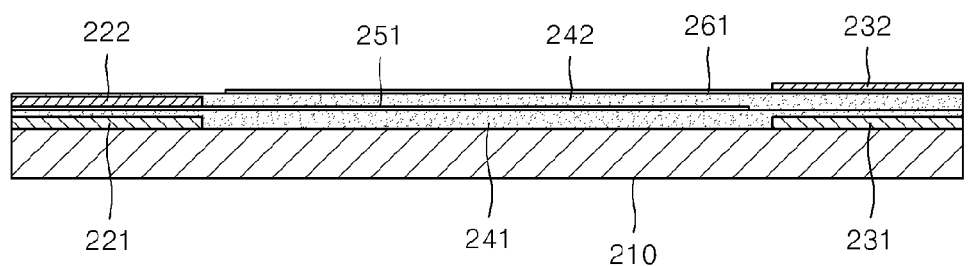

Referring to FIG. 4G, a second metal electrode 232 is formed on a top surface of the second polymer electrode layer 261. The second metal electrode 232 is disposed in a top portion of the region of the second polymer electrode layer 261 under which the second etching prevention layer 231 is formed.

Figure 4H:
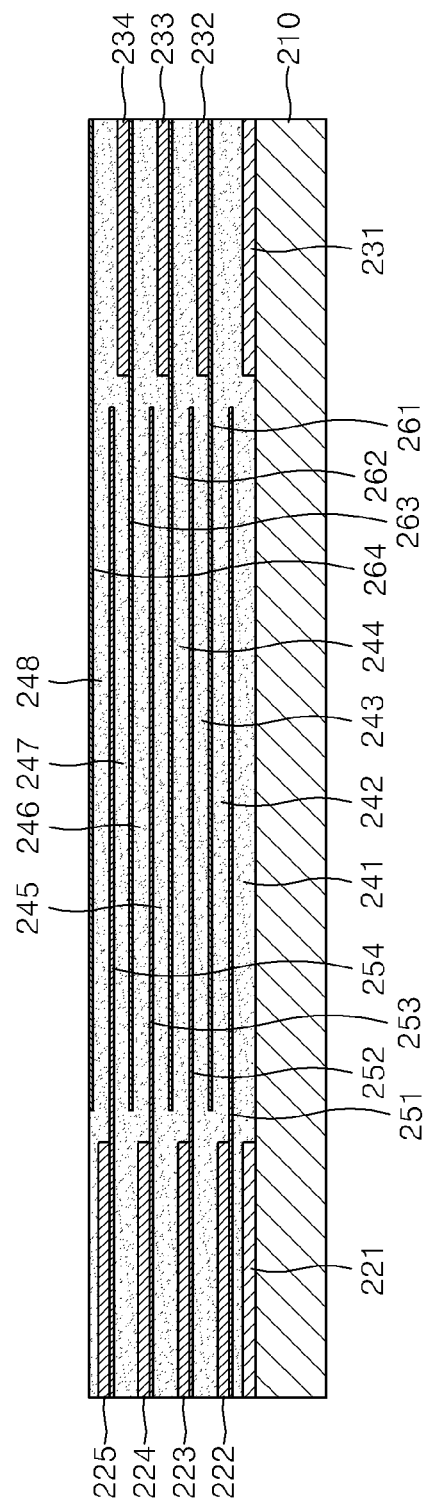

Referring to FIG. 4H, a stacked structure of the polymer deformation layers 241 through 248 and the first polymer electrode layers 251 through 254 and the second polymer electrode layers 261 through 264 disposed between the polymer deformation layers 241 through 248 is formed by repeating the processes described with reference to FIGS. 4A through 4G. The first metal electrodes 222 through 225 are disposed at one end of each of the first polymer electrode layers 251 through 254 and the second metal electrodes 232 through 234 are disposed at the other end of each of the second polymer electrode layers 261 through 264.

Figure 4I:
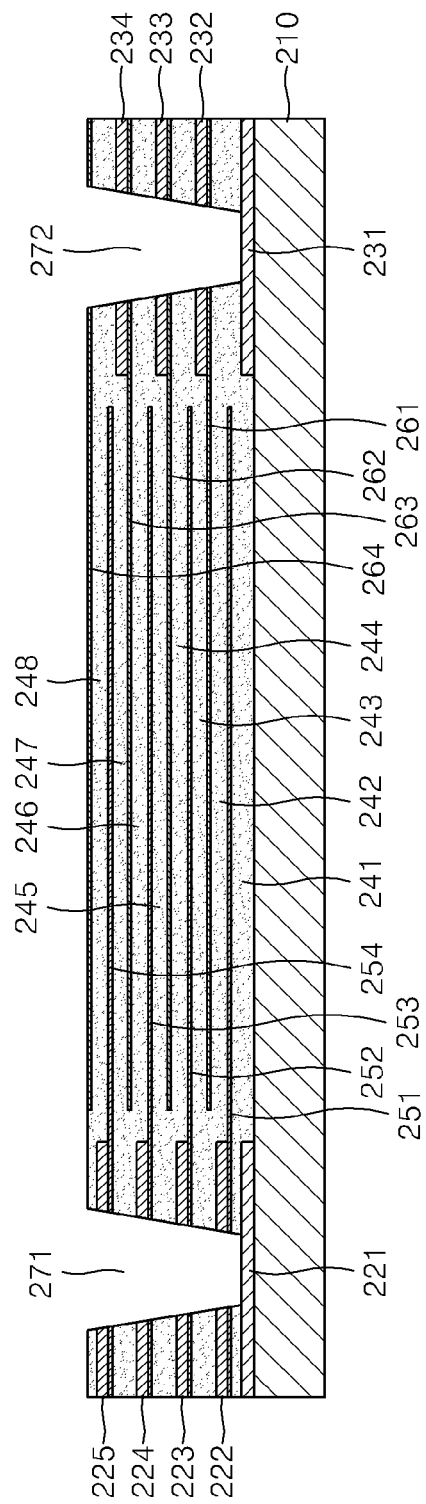

Referring to FIG. 4I, via holes 271 and 272 are formed in both ends of the stack structure in which the first metal electrodes 222 through 225 and the second metal electrodes 232 through 234 are disposed so that the first etching prevention layer 221 and the second etching prevention layer 231 are exposed. The first metal electrodes 222 through 225 and the second metal electrodes 232 through 234 are exposed in side walls of the via holes 271 and 272.

Figure 4J:
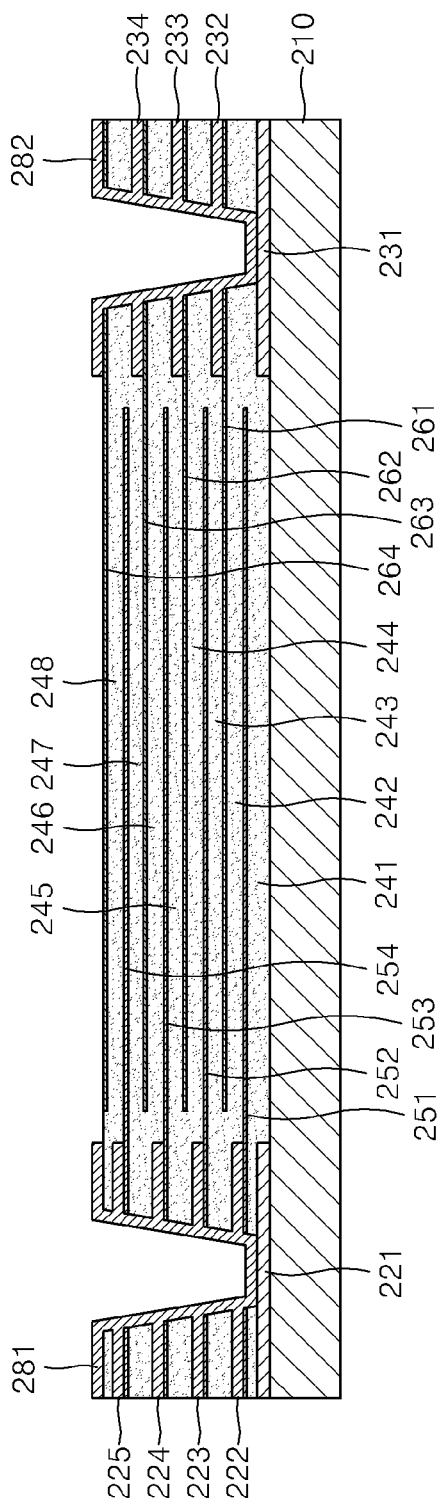

Referring to FIG. 4J, first and second metal terminals 281 and 282 that electrically connect the exposed first metal electrodes 222 through 225 and the second metal electrodes 232 through 234 are formed by plating the via holes 271 and 272. In this state, if the substrate 210 is removed, the polymer actuator 20 is completed. If the substrate 210 is flexible, the substrate 210 may be used as a support layer of the polymer actuator 20.

While exemplary embodiments have been particularly shown and described by using specific terms, the embodiments and terms should not be construed as limiting the scope of the present inventive concept as defined by the claims. The exemplary embodiments should be considered in a descriptive sense only and not for purposes of limitation. Therefore, the scope of the inventive concept is defined not by the detailed description but by the appended claims, and all differences within the scope will be construed as being included in the present inventive concept.

What is claimed is:

1. A method of manufacturing a polymer electrode, the method comprising:
   adhering a shadow mask onto a surface of a substrate, wherein the shadow mask comprises one or more cut-out holes;
   forming a hydrophilic electrode pattern on an exposed region of the surface of the substrate that is not covered by the shadow mask, wherein the exposed region comprises one or more portions of the substrate exposed through the one or more cut-out holes;
   coating the hydrophilic electrode pattern of the substrate with a conductive polymer water solution;
   removing the shadow mask; and
   forming the polymer electrode by drying the conductive polymer water solution.

2. The method of claim 1, wherein the substrate comprises a hydrophobic surface layer, and wherein:
   the adhering the shadow mask comprises adhering the shadow mask to the hydrophobic surface layer of the substrate; and
   the forming of the hydrophilic electrode pattern comprises performing hydrophilic surface reforming on an exposed region of the surface of the hydrophobic surface layer that is not covered by the shadow mask, wherein the exposed region comprises one or more portions of the hydrophobic surface layer exposed through the one or more cut-out holes.

3. The method of claim 2, wherein the performing hydrophilic surface reforming comprises O2 plasma ashing.

4. The method of claim 1, wherein the conductive polymer water solution comprises one of PEDOT:PSS and polyaniline.

5. The method of claim 1, wherein the shadow mask comprises an adhesion layer.

6. The method of claim 5, wherein the adhesion layer comprises one of PDMS and a cellulose based polymer.

7. The method of claim 5, wherein the adhesion layer has a hydrophobic surface.

8. The method of claim 5, wherein the shadow mask further comprises a support layer which supports the adhesion layer.

9. The method of claim 8, wherein the support layer comprises one of PET, PEN, and PI.

10. The method of claim 8, further comprising: removing the support layer after forming the hydrophilic electrode pattern.

11. The method of claim 1, further comprising: squeezing the coated conductive polymer water solution to have a thickness the same as a thickness of the shadow mask.

12. The method of claim 11, wherein a thickness of the polymer electrode is proportional to the thickness of the shadow mask.

13. The method of claim 12, wherein the polymer electrode formed by drying the conductive polymer water solution has a thickness of about 0.01 µm to about 1 µm.

14. The method of claim 2, wherein the hydrophobic surface layer comprises an electroactive polymer in which a displacement occurs according to an electrical stimulus.

15. The method of claim 14, wherein the hydrophobic surface layer comprises a PVDF based polymer.

16. The method claim 15, wherein the hydrophobic surface layer comprises one of PVDF, P(VDF-TrFE), P(VDF-TrFE-CFE), and P(VDF-TrFE-CTFE).

17. A method of manufacturing a polymer electrode, the method comprising:
   forming a polymer deformation layer on a substrate:
   adhering a shadow mask onto a surface of the polymer deformation layer, wherein the shadow mask comprises one or more cut-out holes;
   forming a hydrophilic electrode pattern on a region of the surface of the polymer deformation layer that is not covered by the shadow mask;
   coating the hydrophilic electrode pattern of the polymer deformation layer with a conductive polymer water solution;
   removing the shadow mask; and
   forming a polymer hydrophobic surface layer by drying the conductive polymer water solution.

18. The method of claim 17, wherein the polymer deformation layer comprises a hydrophobic surface, and wherein:
   the adhering the shadow mask comprises adhering she shadow mask to the hydrophobic surface of the polymer deformation layer; and
   the forming of the hydrophilic electrode pattern comprises performing hydrophilic surface reforming on the hydrophobic surface of the polymer deformation layer.

19. The method of claim 17, wherein the conductive polymer water solution comprises one or PEDOT:PSS and polyanyline.

20. The method of claim 17, wherein the shadow mask comprises an adhesion layer.

21. The method of claim 20, wherein the shadow mask further comprises a support layer which supports the adhesion layer.

22. The method of claim 21, further comprising: removing the support layer after forming the hydrophilic electrode pattern.

23. The method of claim 17, further comprising: squeezing the coated conductive polymer water solution to have a thickness the same as a thickness of the shadow mask.

24. The method of claim 23, wherein a thickness of the polymer electrode is proportional to the thickness of the shadow mask.

25. The method of claim 24, wherein the polymer electrode formed by drying the conductive polymer water solution has a thickness of about 0.01 µm to about 1 µm.

26. The method of claim 17, wherein the polymer deformation layer comprises an electroactive polymer in which a displacement occurs according to an electrical stimulus.

27. The method of claim 26, wherein the polymer deformation layer comprises a PVDF based polymer.

28. The method claim 27, wherein the polymer deformation layer comprises one of PVDF, P(VDF-TrFE), P(VDF-TrFE-CFE), and P(VDF-TrFE-CTFE).

29. The method of claim 17, further comprising forming a multilayer structure in which the polymer deformation layer and the polymer electrode layer is alternately stacked is formed by repeating the forming the polymer deformation layer, and forming an electrode pattern.

* * * * *